United States Patent [19]

Hurtig

[11] Patent Number: 5,289,222
[45] Date of Patent: Feb. 22, 1994

[54] DRAIN ARRANGEMENT FOR PHOTORESIST COATING APPARATUS

[75] Inventor: Roy E. Hurtig, Saratoga, Calif.

[73] Assignee: Semiconductor Systems, Inc., Fremont, Calif.

[21] Appl. No.: 904,795

[22] Filed: Jun. 26, 1992

[51] Int. Cl.$^5$ .............................. G03D 5/00
[52] U.S. Cl. .................. 354/317; 354/324; 137/92; 118/688
[58] Field of Search ........... 354/317, 324, 325, 326; 118/610, 634, DIG. 7, 688; 430/311; 137/92; 55/238, 242; 261/79.1, 76

[56] References Cited

U.S. PATENT DOCUMENTS

4,185,975 1/1980 Scharf ............... 118/DIG. 7
4,518,678 5/1985 Allen ..................... 430/311
4,967,782 11/1990 Yamashita et al. ........... 137/92

Primary Examiner—D. Rutledge
Attorney, Agent, or Firm—Skjerven, Morrill, MacPherson, Franklin & Friel

[57] ABSTRACT

A photoresist drainage system for conducting the excess photoresist and solvents from a spin coating machine in a semiconductor fabrication unit is disclosed. The excess photoresist liquid and solvents are channeled directly to an exhaust manifold instead of being collected in a temporary storage tank. From the exhaust manifold the photoresist and solvents flow directly into a factory chemical reclaim system. This substantially reduces the amount of solvent vapors that are drawn into the factory exhaust system.

5 Claims, 7 Drawing Sheets

DRAIN ARRANGEMENT FOR PHOTORESIST COATING APPARATUS

This invention relates to photoresist coating machines used in semiconductor processes and, in particular, to arrangements for removing the excess liquids and vapors from such machines.

BACKGROUND OF THE INVENTION

In the semiconductor processing industry, photoresist is normally applied to semiconductor wafers by means of a spin coating machine. The wafer is placed on a flat vacuum chuck and spun slowly while the photoresist is applied through a nozzle near the center of the wafer. When the wafer is spun at high speed, centrifugal force causes the photoresist to flow towards the circumference of the wafer, thereby covering the surface of the wafer with a smooth, even coat of photoresist.

This process creates two disposal problems. First, an excess of photoresist flows off the edge of the wafer and must be collected and disposed of. Second, the photoresist contains a solvent which vaporizes as the process takes place. These vapors normally flow into the factory exhaust system and must be removed before the exhaust is released to the atmosphere.

Figure 1:
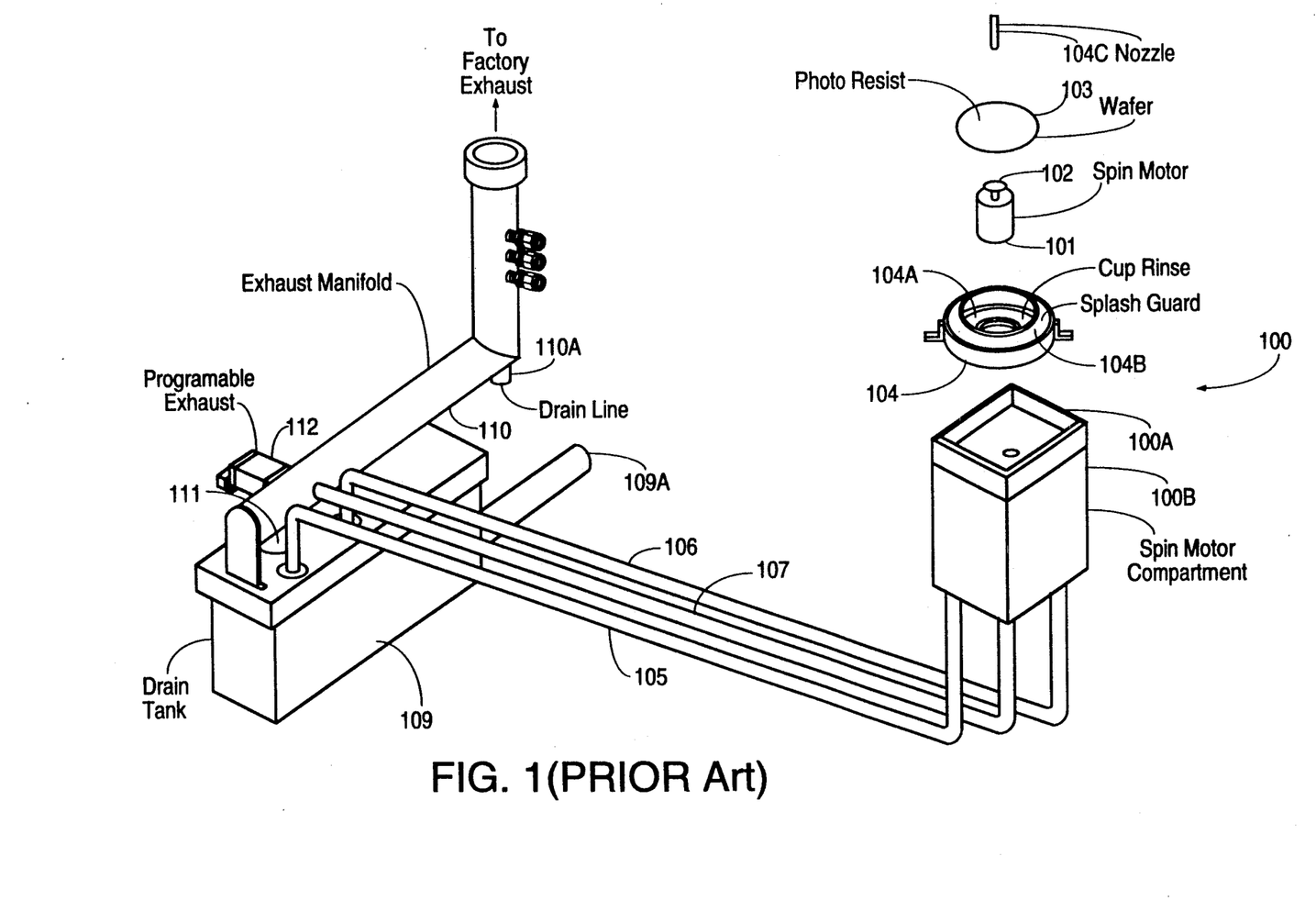
FIG. 1 illustrates a conventional photoresist drainage system.

FIG. 1 illustrates the photoresist drainage system which has been in use by the industry for a number of years. A coating machine 100 is illustrated schematically as containing a spin motor 101 connected to a flat vacuum chuck 102 upon which a wafer 103 is placed. Spin motor 101 is positioned below a catch basin 104.

Figure 2:
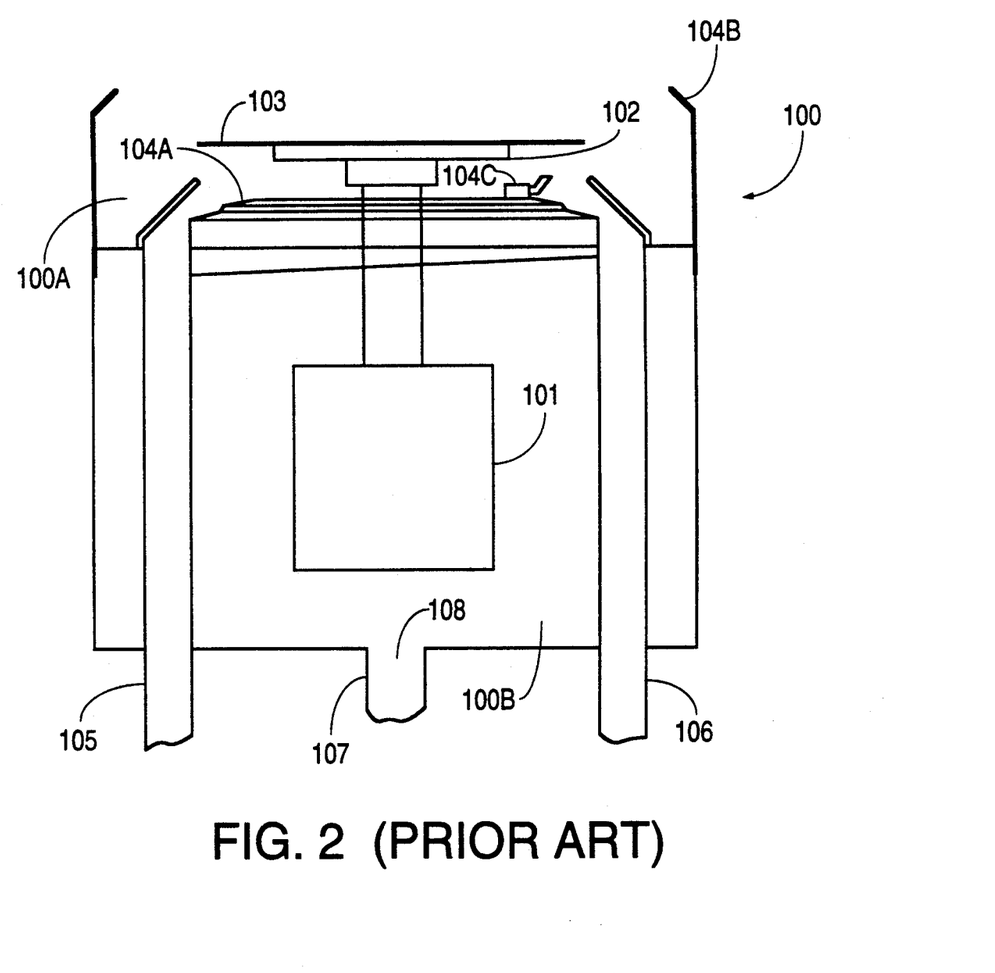
FIG. 2 illustrates a cross-sectional view of a spin coating unit, showing the connections of the drain lines.

A liquid drain line 105, an air purge line 106 and a safety line 107 lead from coating machine 100. As shown in FIG. 2, which is a cross-sectional view of coating machine 100, lines 105 and 106 connect to a coating chamber 100A and line 107 connects to a motor chamber 100B of coating machine 100. Lines 105 and 106 have inlets which are positioned near the spinning wafer so as to purge the vapor in the coat chamber with air and collect the excess liquid photoresist. Safety line 107 has an inlet 108 which is located near spin motor 101. Line 107 does not collect liquid photoresist but functions as a safety line for removing solvent vapors from motor chamber 100B. These vapors are highly volatile and could ignite if they reach excessive concentrations around spin motor Also shown in FIG. 2 are a cup rinse ring 104A and a splash guard 104B. Cup rinse ring 104A contains a number of small holes through which solvent is sprayed to rinse the interior walls of coating chamber 100A Cup rinse ring 104A also contains an edge bead removal nozzle 104C which removes the photoresist built up on the edge of the wafer during coating, as described in U.S. Pat. No. 4,518,678. Cup rinse ring 104A and edge bead removal nozzle 104C are major sources of the solvent which must be disposed of.

Referring to FIG. 1, lines 105 and 106 lead to a drain tank 109, which is used to collect the liquid photoresist. When the liquid photoresist in drain tank 109 reaches a certain level, drain tank 109 is removed and the liquid photoresist is emptied into the factory chemical reclaim system, or the tank can be drained in place through an attached drain pipe.

Line 107 leads to an exhaust manifold 110, which is connected to the factory exhaust system. A connecting line 111 connects drain tank 109 directly to exhaust manifold 110, so that vapors evaporating from the liquid photoresist in drain tank 109 can be removed via exhaust manifold 110 and the factory exhaust system. Exhaust manifold 110 slopes slightly towards a drain line 110A which connects with the factory drainage system. Any vapors which condense in exhaust manifold 110 run into drain line 110A.

Figure 3:
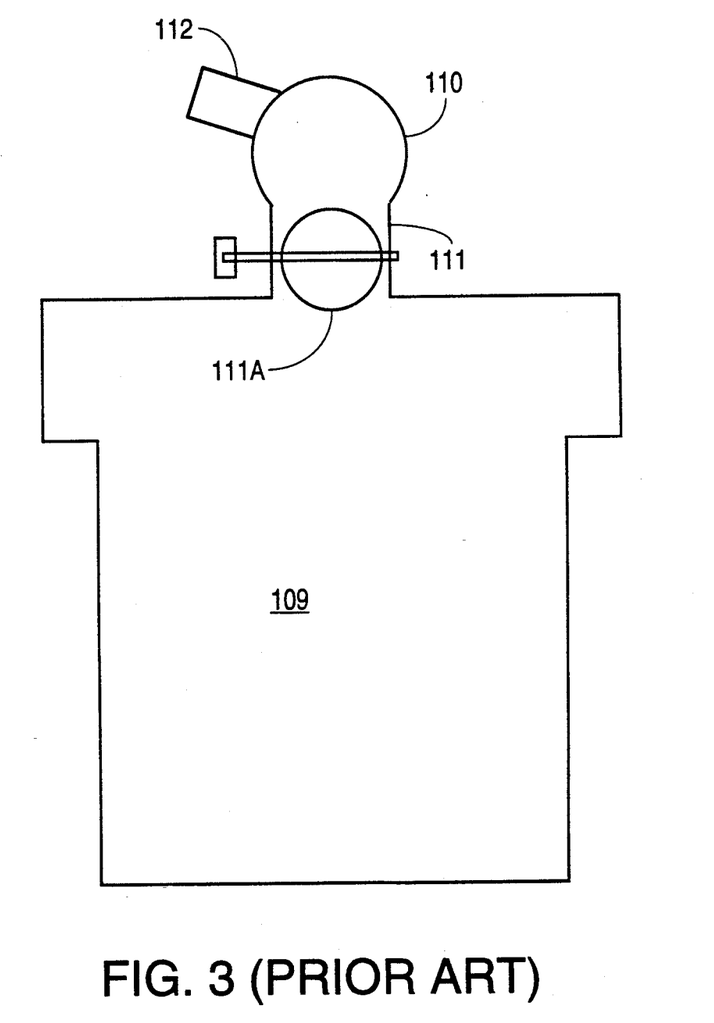
FIG. 3 illustrates a cross-sectional view of the drain tank and exhaust manifold through a section transverse to the exhaust manifold.

When the system is operating, the factory exhaust system provides a suction on exhaust manifold 110 which tends to pull vapors from motor chamber 100B through line 107 and from drain tank 109 by means of connecting line 111. Since lines 105 and 106 are connected to drain tank 109, this suction also tends to pull vapors and air from coating chamber 100A. As each wafer is processed, in order to prevent the photoresist from drying too quickly, a selected concentration of solvent vapor is maintained in the atmosphere in coating chamber 100A. To accomplish this, as illustrated in FIG. 3, a butterfly valve 111A is positioned in conduit 111, under the control of a programmable exhaust unit 112. During the spin coating process, if the programmable exhaust is used, programmable exhaust unit 112 closes the butterfly valve 111A so as to restrict the flow of air and vapor from drain tank 109 to exhaust manifold 110. This in turn limits the flow of vapor and air in lines 105 and 106 and maintains the vapor concentration in coating chamber 100A at an increased level. When the coating process is completed, programmable exhaust unit 112 opens butterfly valve 111A and the normal flow of the solvent vapors and air through lines 105 and 106 into the factory exhaust system is reestablished. For safety reasons, the flow from motor chamber 100B through line 107 is not totally restricted.

The arrangement illustrated in FIG. 1 introduces a considerable amount of solvent vapor into the factory exhaust system. A large proportion of this vapor results from evaporation at the surface of the liquid photoresist and solvents in drain tank 109. Between coating cycles, when butterfly valve 111A is open, a gaseous vapor mixture is sucked through lines 105 and 106. This gaseous mixture flows into drain tank 109 where it creates turbulent flow patterns which increase the rate of solvent evaporation at the liquid surface. This evaporation rate increases as the liquid level in tank 109 gets higher.

With the increasingly stringent air pollution requirements, a substantial portion of the solvent vapors must be removed from the factory exhaust system before they reach the atmosphere. Reducing the amount of vapors that enter the exhaust system in the first place would help solve this problem and reduce the costs of environmental compliance. This invention accomplishes both of these purposes.

SUMMARY OF THE INVENTION

In accordance with this invention, the drain tank is completely eliminated, and the drain lines extending from the coating chamber run directly into the exhaust manifold. The exhaust manifold is provided with a liquid drain line which feeds directly into the factory chemical reclaim system. With the drain tank eliminated, there is no reservoir of liquid photoresist and solvents from which evaporation can take place. This significantly reduces the amount of solvent vapor which is introduced into the factory exhaust system.

In addition, the drain lines terminate near the surface of the exhaust manifold, thereby eliminating the dripping of photoresist and solvent into the air stream. This acts like a liquid separator if extended to the far wall and further decreases the amount of solvent vapor in the air stream.

DESCRIPTION OF THE INVENTION

Figure 4:
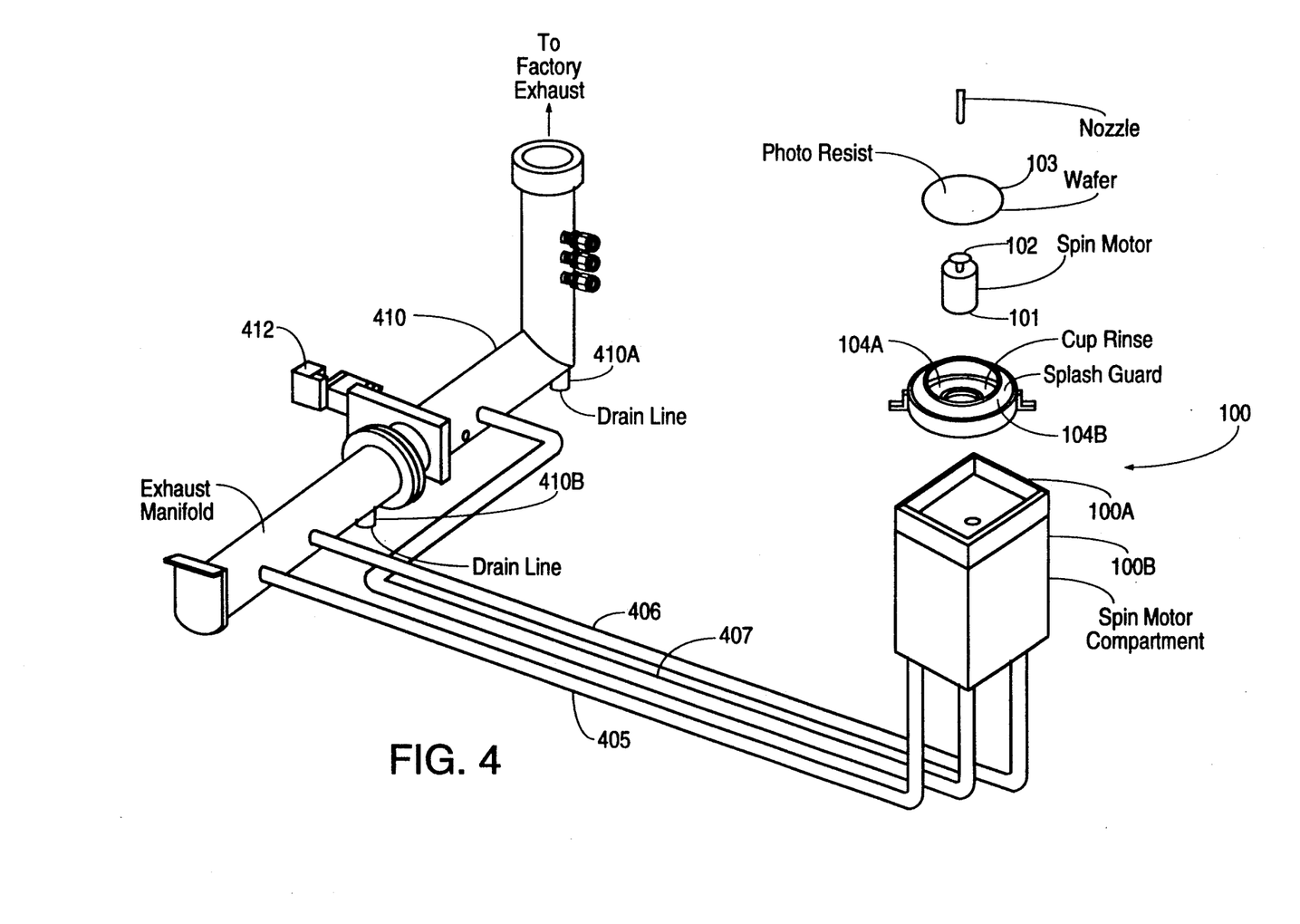
FIG. 4 illustrates a photoresist drain system in accordance with the invention.
Figures 5, 6B:
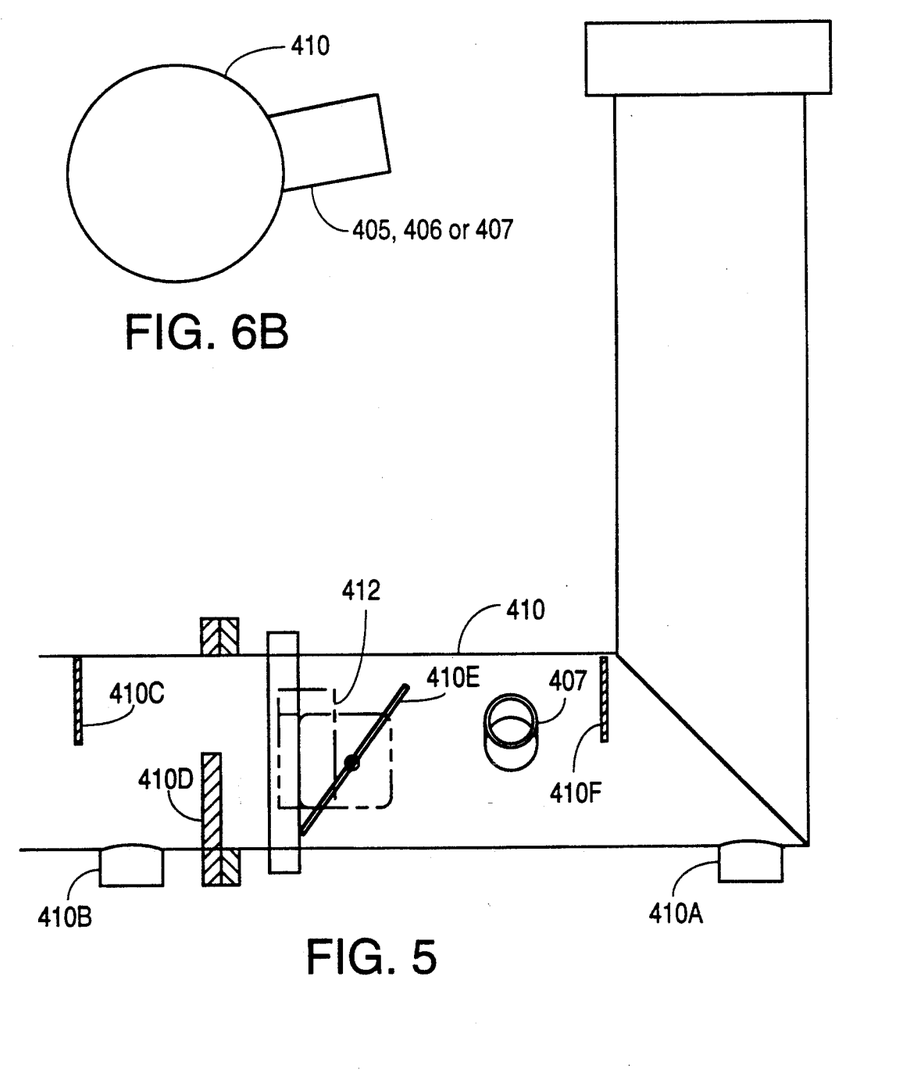
FIG. 5 illustrates a longitudinal cross-sectional view of the exhaust manifold.
FIGS. 6A and 6B illustrate cross-sectional views showing alternative ways of connecting a drain line to the exhaust manifold in accordance with the invention.

FIG. 4 illustrates a photoresist drain system in accordance with the invention. Photoresist coating unit 100 and its components are identical to those illustrated in FIG. 1. Drain lines 405 and 406 are connected to the coating chamber 100A and a safety line 407 connects to motor chamber 100B. An exhaust manifold 410 feeds two drain lines, designated 410A and 410B, respectively. Exhaust manifold 410 slopes slightly in the direction of drain line 410A. As illustrated in FIG. 5, positioned between drain lines 410A and 410B are baffles 410D and 410F and a butterfly valve 410E. A baffle 410C is positioned upstream of drain 410B. Butterfly valve 410E is controlled by a programmable exhaust unit 412. As is apparent from FIGS. 4 and 5, drain lines 405 and 406 enter exhaust manifold 410 upstream of butterfly valve 410E whereas safety line 407 enters exhaust manifold 410 downstream of butterfly valve 410E.

Drain lines 405 and 406 draw air, vapor and excess photoresist from coating chamber 100A of coating machine 100 and feed them directly to exhaust manifold 410. When the liquid photoresist reaches exhaust manifold 410, it flows toward drain line 410B where it is directed into the factory chemical reclaim system. Baffle 410D prevents the liquid from flowing further down exhaust manifold 410. The combined effect of baffles 410C and 410D causes some of the vapor which accompanies the photoresist to condense, and the resulting liquid flows into drain line 410B. Baffle 410F and the change of direction of the air stream produces further condensation of the vapors.

Butterfly valve 410E operates in the same timing sequence as butterfly valve 111A in conduit 111 (FIG. 1). During the coating process, butterfly valve 410E is actuated by programmable exhaust unit 412 to its restrictive position, thereby increasing the concentration of solvent vapors in coating chamber 100A. At other times, butterfly valve 410E is open, allowing air and solvent vapors to be pulled into the factory exhaust. However, because the drain tank has been eliminated, the volume of solvent vapors that are introduced into the factory exhaust are greatly reduced as compared with the embodiment illustrated in FIG. 1.

Safety line 107 enters exhaust manifold 110 at a position downstream from the butterfly valve and thus air and solvent vapors are continuously withdrawn from motor chamber 100B.

Figure 6A:
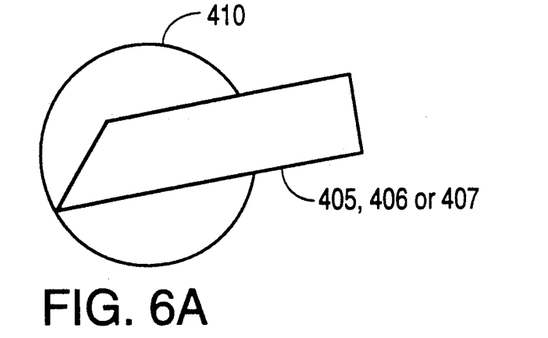

FIGS. 6A and 6B illustrate alternative structures for connecting lines 405-407 into exhaust manifold 410. Lines 405-407 are shown in cross section. In FIG. 6A, the lines extend to the far side of exhaust duct 410; in FIG. 6B, the lines end at the near side of exhaust duct 410. In either case, any photoresist liquid in the lines flows down the side of exhaust duct 410, as shown by the arrows, and is removed from the system. This arrangement minimizes the formation of vapors that must be removed through the factory exhaust.

Figure 7:
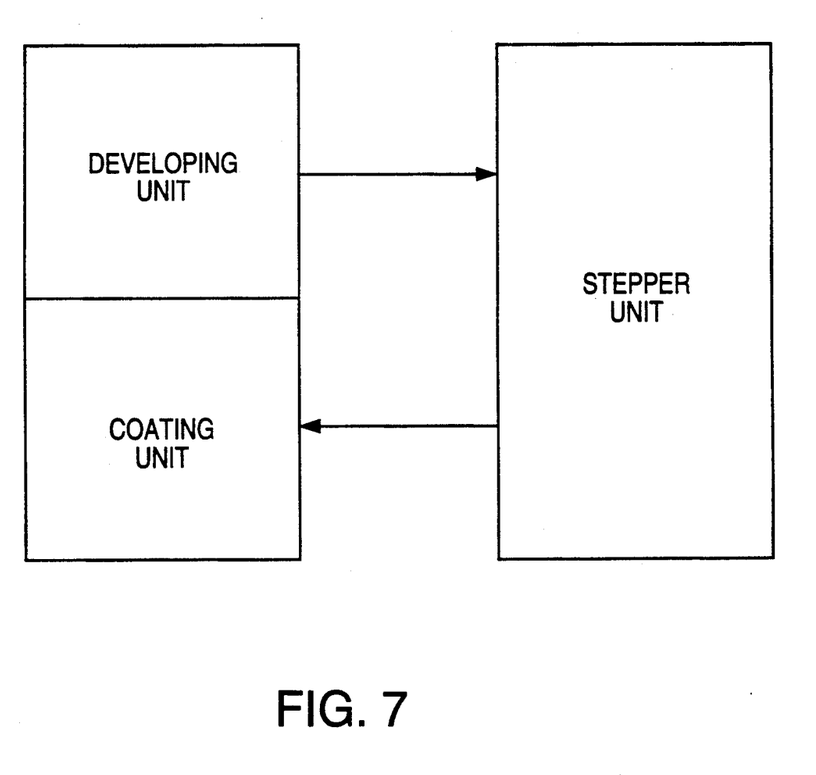
FIG. 7 illustrates a block diagram of a two-track coater/developer unit and a stepper unit.

Spin coating units are often used in conjunction with developing units in the manner pictured in FIG. 7. The wafers are delivered to a coating unit which applies the photoresist in a uniform layer as described above. After the photoresist has been heated and dried, the wafer proceeds to a stepper unit where masks are used to expose the photoresist in a pattern. Thereafter, the wafers pass to a developer unit where the exposed photoresist is developed prior to etching. The coating and developing units are often combined into a two-track coater/developer unit as illustrated in FIG. 7.

Figure 8:
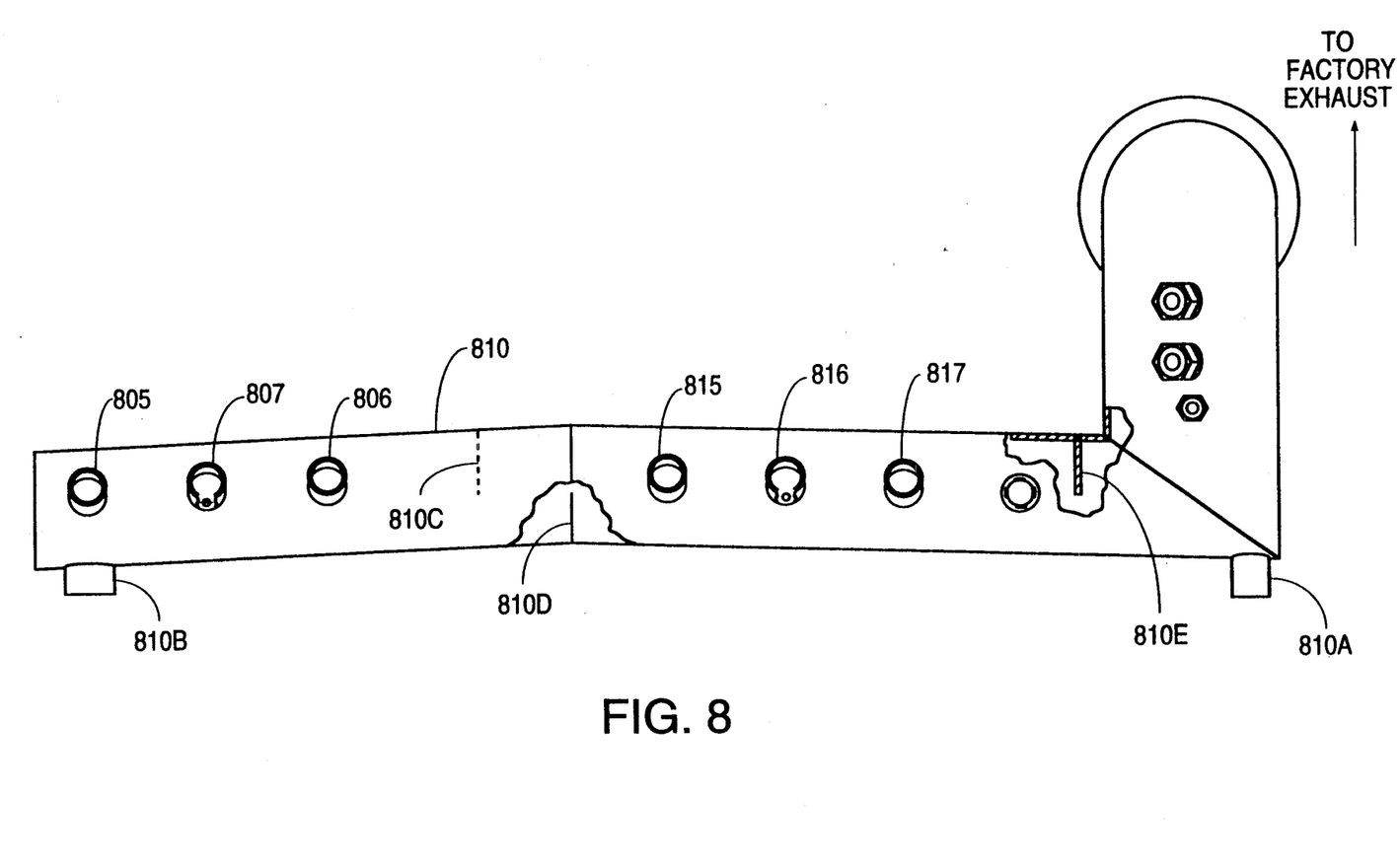
FIG. 8 illustrates a cross-sectional view of the exhaust manifold in a two-track coater/developer unit in accordance with the invention.

FIG. 8 illustrates a cross-sectional view of an exhaust manifold 810 in a drain system in accordance with the invention used in a two-track coater/developer unit. In such an arrangement, it is important that the excess photoresist not be mixed with the excess developer solution, since these liquids are collected in separate factory chemical reclaim systems. A drain line 810A is used for the developer solution, and a drain line 810B is used for the photoresist. An upper baffle 810C and a lower baffle 810D are positioned near the center of exhaust manifold 810. On either side of lower baffle 810D, exhaust manifold 810 slopes toward drains 810A and 810B, respectively. The left end of exhaust manifold 810 is closed; the right end connects to the factory exhaust system. A baffle 810E positioned near the right end of exhaust manifold 810 helps promote the condensation of liquid as the vapors are drawn into the factory exhaust system.

Lines 805-807 are shown as entering exhaust manifold 810 to the left of baffle 810D. These lines connect to spin coating machine 100 (not shown in FIG. 8). Lines 805 and 806 connect to coating chamber 100A, and line 807 connects to motor chamber 100B. The excess liquid photoresist flows through lines 805 and 806 and runs into drain 810B. The solvent vapors in lines 805-807 are drawn into exhaust manifold 810 and past baffles 810C and 810D, which cause some of the vapors to condense. The condensed liquids flow to the left and into drain 810B. It will be noted that in this embodiment, there is no programmable butterfly valve to regulate the flow in lines 805 and 806 but each line has a butterfly valve which can be manually set.

Lines 815, 816 and 817 connect to the developer unit and carry excess developer solution into exhaust manifold 810 and out through drain line 810A. Thus, the configuration of exhaust manifold 810 keeps the excess photoresist with its solvents and excess developer solution separate, except for a small amount of photoresist solvent vapor which condenses at the right end of exhaust manifold 810. This small amount of solvent does not create a problem when mixed with the developer solution in drain line 810A.

The embodiments described above are illustrative only, and many alternative embodiments in accordance with this invention will be apparent to those skilled in the art. All such alternative embodiments are included within the broad scope of this invention, as defined in the following claims.

I claim:

1. A drain system for a photoresist coating machine, said system comprising:

an exhaust manifold;

a drain line for transporting excess liquid photoresist and solvent from a spin coating chamine to said exhaust manifold, said drain line being configured such that liquid photoresist is not permitted to come to rest as it slows from aid coating machine to said exhaust manifold;

a safety line for transporting solvent vapors from a motor chamber in said spin coating machine to said exhaust manifold;

a means for connecting said exhaust manifold to an exhaust system; and a means for connecting said exhaust manifold to a chemical reclaim system.

2. The drain system of claim 1 wherein said drain line enters said exhaust manifold at a near wall thereof and terminates at a far wall of said exhaust manifold.

3. The drain system of claim 1 wherein said safety line extends from said motor chamber to a position in said exhaust manifold downstream from the position where said drain line joins said exhaust manifold, a valve being positioned in said exhaust manifold at a location upstream from the position where said safety line joins said exhaust manifold.

4. The drain system of claim 3 wherein said exhaust manifold includes a drain for removing liquid photoresist and solvent.

5. The drain system of claim 1, said exhaust manifold being connected to a developing unit.

* * * * *

UNITED STATES PATENT AND TRADEMARK OFFICE
CERTIFICATE OF CORRECTION

PATENT NO.    :   5,289,222
DATED         :   February 22, 1994
INVENTOR(S)   :   Roy E. Hurtig It is certified that error appears in the above-identified patent and that said Letters Patent is hereby corrected as shown below:

Col. 1, line 47, after "motor", insert —101.—.

Col. 1, line 51, after "100A", insert --.--.

Col. 3, line 21, delete "cross-sectional" and substitute --broken away side--.

Col. 4, line 26, delete "cross-sectional" and substitute --broken away side--.

Col. 5, line 13, delete "chamine" and substitute --machine--;

Col. 5, line 16, delete "slows" and substitute --flows--; and delete "aid" and substitute --said--.

Signed and Sealed this

Seventeenth Day of January, 1995

Attest:

BRUCE LEHMAN

*Attesting Officer*      *Commissioner of Patents and Trademarks*